United States Patent
Fournel et al.

(10) Patent No.: US 9,769,931 B2
(45) Date of Patent: Sep. 19, 2017

(54) METHOD FOR PRODUCING AN ELECTRONIC DEVICE

(71) Applicant: COMMISSARIAT A L'ENERGIE ATOMIQUE ET AUX ENERGIES ALTERNATIVES, Paris (FR)

(72) Inventors: Franck Fournel, Villard-Bonnot (FR); Chrystel Deguet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/223,718

(22) Filed: Jul. 29, 2016

(65) Prior Publication Data

US 2017/0034919 A1    Feb. 2, 2017

(30) Foreign Application Priority Data

Jul. 31, 2015   (FR) ..................... 15 57436

(51) Int. Cl.
    *H05K 3/00* (2006.01)
    *H05K 3/30* (2006.01)
    *H01L 21/18* (2006.01)
    *H01L 21/762* (2006.01)
    *H01L 27/06* (2006.01)

(52) U.S. Cl.
    CPC ......... *H05K 3/0017* (2013.01); *H01L 21/187* (2013.01); *H01L 21/76254* (2013.01); *H01L 27/06* (2013.01); *H05K 3/30* (2013.01)

(58) Field of Classification Search
    None
    See application file for complete search history.

(56) References Cited

U.S. PATENT DOCUMENTS

| | | | |
|---|---|---|---|
| 6,423,614 B1 | 7/2002 | Doyle | |
| 6,744,116 B1 | 6/2004 | Doyle | |
| 7,781,300 B2* | 8/2010 | Moriceau | H01L 21/76224 257/E21.564 |
| 8,318,555 B2* | 11/2012 | Signamarcheix | H01L 21/76254 257/64 |

(Continued)

FOREIGN PATENT DOCUMENTS

| | | |
|---|---|---|
| FR | 2 848 725 | 6/2004 |
| FR | 2 973 569 | 10/2012 |

(Continued)

OTHER PUBLICATIONS

French Preliminary Search Report issued Apr. 19, 2016 (with Written Opinion) in French Application 15 57436 filed on Jul. 31, 2015 (with English Translation of Categories of Cited Documents).

*Primary Examiner* — Shamim Ahmed
(74) *Attorney, Agent, or Firm* — Oblon, McClelland, Maier & Neustadt, L.L.P.

(57) ABSTRACT

A method for producing an electronic device including in a stack at least a first structure and a second structure, the structures being obtained from a first substrate and a second substrate. Marks are obtained from a pattern made on one of the substrates. Furthermore, the same supporting members are used during the bonding phase for the preparation of the marks and for the bonding phase for the assembly of the structures.

14 Claims, 2 Drawing Sheets

(56) References Cited

U.S. PATENT DOCUMENTS

| | | | |
|---|---|---|---|
| 2004/0241960 A1* | 12/2004 | Maurice | H01L 21/76254 438/458 |
| 2005/0101095 A1 | 5/2005 | Fournel et al. | |
| 2006/0148256 A1 | 7/2006 | Vinet et al. | |
| 2007/0007237 A1* | 1/2007 | Wu | B23K 3/0623 216/2 |
| 2012/0006463 A1 | 1/2012 | Gaudin | |
| 2013/0210171 A1 | 8/2013 | Gaudin | |
| 2015/0348933 A1 | 12/2015 | Gaudin | |

FOREIGN PATENT DOCUMENTS

| | | |
|---|---|---|
| FR | 2 975 109 | 11/2012 |
| WO | WO 02/054466 A1 | 7/2002 |

* cited by examiner

METHOD FOR PRODUCING AN ELECTRONIC DEVICE

FIELD OF THE INVENTION

The invention relates to a method for producing an electronic device comprising in a stack at least a first structure and a second structure.

One benefit of the invention is that of enabling correct alignment of the stacked structures. It particularly finds an application in the manufacture of three-dimensional microelectronic devices, for which the components are no longer or no longer merely situated in a single plane of a substrate, but are also produced in overlaid form, by means of layers of overlaid substrates incorporating components. More specifically, the present invention is applicable for example to the production of backlit imaging devices and the production of a stack of two CMOS substrates.

PRIOR ART

Three-dimensional devices require assemblies of structures (typically substrates having undergone treatments). The correct matching of these structures is a fundamental issue for the reliability of the final device and for reducing the size of the components, such as electrical contacts on the surface of two structures and which should engage with one another.

Known assembly methods use markings further serving as references in many microelectronic treatment steps.

As a general rule, on a substrate having patterns, there are two major categories of marks:

Primary alignment marks which are frequently low in number and situated on either side of the substrates. These primary alignment marks make it possible, on the same substrate, to locate secondary alignment marks Secondary alignment marks are generally much more numerous and are repeated on the surface of the substrate the number of times that a group of patterns is to be repeated in a plurality of unitary zones. These secondary alignment marks make it possible to create patterns by ensuring the very precise positioning thereof within the same unitary zone. There are thus much more patterns than secondary alignment marks. The patterns are created by positioning same with respect to the secondary marks. They may extend along the thickness of the substrate, and for example consist of layers of dielectric or semiconductor materials.

As a general rule, when a first substrate is mounted on a second substrate and it is sought to align patterns of each unitary zone of the two substrates, the offset possibilities are as follows.

A first misalignment is due to the alignment precision of the mounting of one substrate on the other. This misalignment, which is general as it relates to all patterns, is notably obtained by measuring the misalignment between the primary marks of the first substrate with respect to the primary marks of the second substrate.

A second misalignment is that of the secondary alignment marks with respect to the primary marks in the same substrate during the production thereof. This misalignment is in fact poor positioning of the secondary marks with respect to the primary marks. It may be of the order of more or less 50 nm for example. However, this poor positioning will imply poor overall positioning of the patterns of a unitary zone with respect to the primary alignment marks.

This defect may arise even if the first source of misalignment, mentioned in the previous paragraph, is slight or non-existent. The patterns of the first substrate will not be correctly aligned with respect to the patterns of the second substrate. As this misalignment may arise at random and have a random amplitude for each unitary zone, it is thus very difficult, or even impossible, to correct during the overall alignment of the substrates for mounting.

A third source of misalignment is due to the wafer deformation of the substrates during the mounting operation. In particular, direct bonding causes warping. This warping may modify the relative positioning of the secondary marks as these marks are precisely situated at the bonding interface.

These displacements of the alignment marks may be sufficiently great to prevent the subsequent technological processes from being carried out. For example, after bonding and thinning making it possible to have access to the alignment marks of one of the substrates notably for CMOS technologies, warping may prevent lithography machines from locating the secondary alignment marks thus preventing further lithography steps from being carried out.

These displacements may also be problematic as they do not only affect the secondary alignment marks; they also affect the set of both bonded surfaces. If the aim of bonding was, for example to place the patterns facing each other in order to create a vertical interconnection and the relative position of said surface patterns is excessively disrupted by warping, they may even no longer find themselves facing one another on either side of the bonding interface and thus no longer allow the vertical connection sought.

From the document WO02054466 A1, in a specific application associated with crystalline orientations, a method is known enabling the control of the crystalline orientation between two monocrystals by producing, from the same crystal, the two surfaces to be bonded. This invention makes it possible to align macroscopically the crystalline axes of two surfaces without knowing the direction thereof beforehand, with rotation of the substrates. This invention relates to the overall adjustment of crystalline axes but does not disclose how to prevent the displacement of any secondary marks, and does not provide a solution to problems in respect of positioning marks with a view to mounting a structure comprising a substrate onto another. It is further not compatible with substrates wherein the layers to be assembled are not monocrystalline.

The present invention makes it possible to remedy all or part of the technical drawbacks currently known.

SUMMARY OF THE INVENTION

One aspect of embodiments of the invention relates to a method for producing an electronic device comprising in a stack at least a first structure and a second structure, the structures being obtained from a first substrate and a second substrate. Advantageously, the following steps are performed:

formation of at least one hollowed mark pattern on a second face, opposite a first face, of the first substrate;

positioning of the first face of the first substrate on a first supporting member;

positioning of a first face of the second substrate on a second supporting member;

assembly of the two substrates by the second face of the first substrate and a second face, opposite the first face, of the second substrate;

separation of the first substrate into two parts according to a dimension in thickness of the first substrate so as to form a first part of the first substrate remaining in position on the first supporting member, and a second part of the first substrate remaining assembled with the second substrate, the first part of the first substrate comprising a first mark formed by a first portion of the mark pattern, the second part of the first substrate comprising a second mark formed by a second portion of the mark pattern;

production of at least one electronic component on the first part of the first substrate so as to form the first structure and of at least one electronic component on the second part of the first substrate so as to form the second structure;

assembly of the first structure and the second structure, the first face of the first substrate being in position on the first supporting member and the first face of the second substrate being in position on the second supporting member, by approaching the first supporting member and the second supporting member while aligning the first mark and the second mark.

A further aspect of embodiments of the invention relates to a device which can be obtained using the method according to the invention.

As such, the marks of the first structure and the second structure find the manufacturing source thereof in a single mark pattern such that they are perfectly cohesive. Furthermore, the method observes a continuity pattern in respect of positioning of the structures in supporting members which are identical both for the operation for assembling the initial substrates and for the operation for assembling the final structures. In this way, the risks of lack of alignment between the first mark and the second mark are removed such that the stacked mounting of the two structures is very precise in the location thereof.

INTRODUCTION TO THE DRAWINGS

The attached drawings are given by way of examples and are not limiting in respect of the invention. They represent only one embodiment of the invention and will make it possible to easily understand same.

Figure 1:
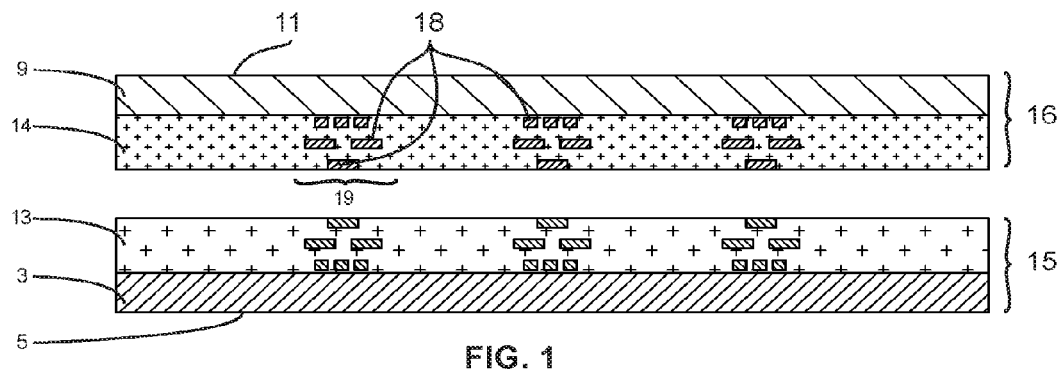
FIG. 1 is a sectional view, along the thickness thereof, of two structures made to form a stacked microelectronic device.

The thicknesses of the various layers represented in the figures are not necessarily to scale.

DETAILED DESCRIPTION

Further aims and advantages will emerge during the description hereinafter of illustrative but non-limiting embodiments of the invention.

Before going into detail on these embodiments, a brief introduction is given hereinafter of preferred but non-limiting alternative embodiments suitable for use alone or according to any combinations with each other and with any aspect according to the claims, the invention is such that:

the assembly of the two substrates comprises approaching the first supporting member and the second supporting member, contacting by localized pressure of the second surface of the first substrate and the second face of the second substrate so as to produce direct bonding, followed by detachment of the first face of the second substrate relative to the second supporting member. The approaching distance is identical for both bonds;

the formation of at least one mark pattern comprises: etching of the mark pattern with a predetermined height according to a dimension in thickness of the first substrate; formation of a weakened zone, said weakened zone having a height level lower than the height of the mark pattern and the separation of the first substrate into two parts comprises a treatment configured to break the weakened zone; this weakened zone optionally being produced before or after etching the pattern.

formation of an electrically insulating layer on the second face of the first substrate before the separation of the first substrate into two parts.

The features described above are merely optional and not necessarily executed in this order.

The method according to the invention makes it possible to manufacture a so-called electronic device in that it comprises electrical parts on structures which may, preferably, comprise a substrate made of semiconductor material notably based on silicon. The term "substrate" denotes any optionally semiconductor supporting member, forming all or part of a structure. It may be mono or multilayer. Typically, the orientation of the substrate defines, on either side of the thickness thereof, two faces. Within the scope of the invention, one of the faces of a given substrate may engage with a supporting member, which is preferably an element of a tool used during manufacture. The other face may serve to carry out treatments such as the formation of layers on top of the substrate, formation of patterns in the substrate and/or added layers, formation of simple (such as electrical distribution lines) or complex electronic components (such as transistors). The expression electronic component denotes any member suitable for having an application in the field of electronics and microelectronics. The term electronic component is not limited to components having an electrical function. It is not excluded that the first face is also used for treatment, for example in a subsequent phase to those described herein. Treatments may also comprise the formation of components passing through the thickness of the substrate, such as vias.

The device manufactured according to the invention is obtained from a stack of structures based on substrates as described in the preceding paragraph. It may consist of a microelectronic device. The term microelectronics denotes all microelectronic and nanoelectronic techniques. The devices that can be formed may be placed in systems such as so-called MEMS micro-electromechanical systems and/or systems with optical functions.

The examples described hereinafter are stacks of two structures but this number is not restrictive and the method according to the invention may be repeated for more than two structures. Notably, it is possible to assemble two structures in a first phase, the device obtained thus forming a new overall structure which may then be assembled with another structure, so as to produce a device with three underlying structures.

Within the scope of the present invention, terms such as "on" or "above" do not necessarily mean "in contact with". As such, for example, the presence of a layer on another layer does not necessarily mean that they are in contact. This likewise does not mean that the element situated above the other covers same completely.

The term "thickness" denotes, unless arranged otherwise, a dimension along the thickness of the substrate(s), for example perpendicular to a plane of a surface of the substrate. Similarly, the term "width" denotes, unless arranged otherwise, a dimension perpendicular to the thickness of the substrate.

FIG. 1 shows an example of a configuration of two structures to be assembled. A first structure 15 is herein in the lower position and has a base from a first substrate 3 described hereinafter topped with a functional assembly 13 for example in the form of a plurality of layers and/or components 18 fulfilling a notably electric function. These components are merely represented schematically by patterns of different materials than the rest of the layer(s) containing same. Although this is not illustrated, the first substrate 3 may equally well comprise components. For example, vias (such as TSVs, or Through Silicon Vias) may be formed therein. The invention thus makes no assumptions on the configuration of the first structure 15.

Furthermore, FIG. 1 shows a second structure 16. It comprises a base wherein a first face 11 is obtained from a second substrate 9, and a functional assembly 14. The indications given above for this type of structure components 18, with reference to the first structure 15 are valid for the second structure 16.

The second structure 16 is oriented such that a face to be assembled is facing a face to be associated therewith of the first structure 15, these faces being advantageously directed along planes parallel and perpendicular to the thickness of the substrates. For this mounting, so-called marks (not illustrated in FIG. 1) are used, which will make it possible to finely align the two structures 15, 16. The term alignment denotes the matching of the two structures along a plane perpendicular to the thickness thereof. This notably enables contacting of electrical parts exposed on the surface of the two structures 15, 16. Further, so-called secondary, marks (not illustrated in FIG. 1), may also be used, in zones 19 for producing electronic chips. In particular, the invention may be used, based on wafers, for example using silicon, to produce in groups, a plurality of chips of the same type, chips which are distributed on the surface of the wafers and which will be subsequently individualized by cutting zones. The term chip denotes any electronic system including the components mentioned above. The secondary marks may be reproduced in each zone 19 to serve as proximity references for the machines used for manufacturing the chips.

A possibility for the fabrication of these primary and optionally secondary marks is described hereinafter, with reference to FIGS. 2 to 9. The latter merely show partial views of substrates revealing the formation of a mark. However, marks may be produced, preferably simultaneously, by reproducing the principle illustrated at a plurality of points of the surface of the substrates.

Figure 2:
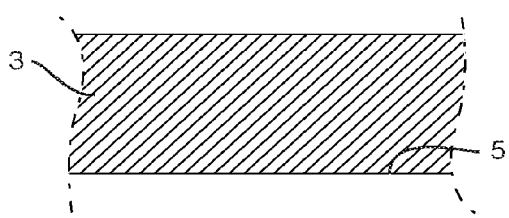
FIG. 2 is an illustration of an initial substrate forming the basis of a first structure.
Figure 3:
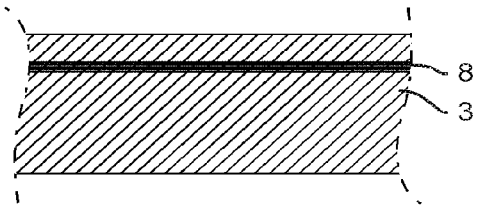
FIGS. 3 to 5 show treatment phases of the first substrate.

With reference to FIG. 2, an initial step may start with a first substrate 3, for silicon, which may typically be a circular wafer 300 mm in diameter; the resistivity thereof is in one example of 14 ohm/cm with P-type doping.

A weakened zone 8 is then produced (subsequently or before the step for forming the insulating layer and/or before the formation of the mark pattern described hereinafter) in the first substrate 3. The first weakened zone 8 denotes a zone, situated in the thickness of the substrate 3 and preferably not exposed on the surface of this substrate 3, having a lower mechanical strength that the zones surrounding same. This weakening may be obtained by ion implantation of hydrogen atoms with an energy of 55 keV with a dose of $6.10^{16}$ at/cm$^2$ to place the level of the implantation peak of hydrogen at 150 nm from the bottom of the pattern 6 of the alignment marks. The implantation peak is thus situated advantageously in the thickness of the pattern 6 which is formed either previously, or subsequently as in FIG. 4. As an alternative to ion implantation, the weakened zone 8 may consist of a layer of the substrate 3, with different mechanical properties to the other layers. Typically, the fabrication of the substrate 3 may comprise the formation of a porous layer followed by growth of a non-porous layer, such that the porous layer inside the substrate is the location of weakening thereof.

Figure 4:
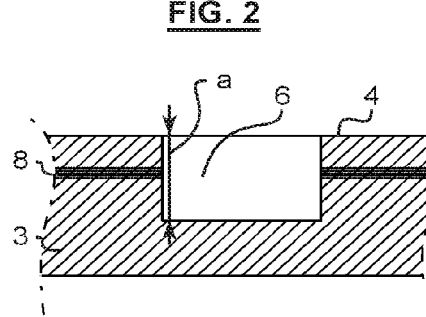
Figure 5:
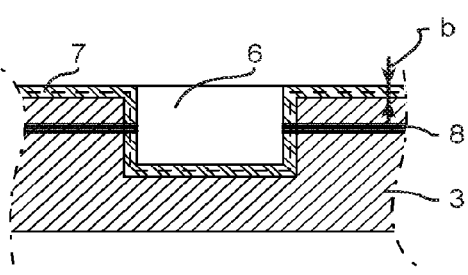

In FIG. 4, the pattern 6 is produced on the second face 4 of the substrate 3 to be used for the creation of two marks 6a, 6b each on one of the structures 15, 16, this common origin of the marks ensuring the perfect alignment thereof. The pattern may be etched with for example photolithography steps. The etching depth (referenced "a" in FIG. 4), in the first substrate 3 made of silicon for example, of these marks is optionally 350 nm. A pattern having a rectangular or square cross-section may be suitable but further shapes are possible.

An electrically insulating layer 7 having a thickness "b" is then produced, preferably by thermal oxidation which may be performed at 950° C. in water vapor to obtain an oxide layer of 100 nm in thickness which consumes the substrate 3 slightly from the second face 4 thereof, over approximately 50 nm in the case of silicon. The result can be seen in FIG. 5. This layer 7 may be used, alternatively to or cumulatively with the insulation function, to facilitate direct bonding.

A second substrate 9 is then used. It may also be made of silicon, for example 300 mm in diameter wherein the resistivity is 14 ohm/cm with P-type doping. The two substrates 3, 9 may have different formats.

The two substrates may then optionally undergo cleaning, typically chemical with a first cleaning using a known sulfuric acid, hydrogen peroxide solution in proportions of 3:1, using a 96% by volume sulfuric acid solution and a 30% by volume hydrogen peroxide. The cleaning time is for example 10 min at 180° C. After rinsing for 10 min in deionized water, a second cleaning is performed, non-restrictively based on ammonia, hydrogen peroxide and deionized water in proportions of 1:1:5 using 30% by volume hydrogen peroxide for 10 min at 71° C. The substrates 3, 9 are then rinsed and dried.

The first substrate 3 is then placed on a supporting member 1 by the first face 5 thereof used to secure same in position during treatment steps. The supporting member 1 is notably a chuck. The supporting member 1 comprises in the example a plate with a surface, advantageously plane, suitable for receiving a first face 5 of the substrate 3. It may comprise elements for holding the substrate 3, in particularly by suction on a ring 17 shown in FIG. 10 leading to the first face 5 and connected to a negative pressure circuit. However, further securing means may exist.

The second substrate 9 is in turn borne by a supporting member 2 with which it engages by the first face 11 thereof.

A supporting member 2 having the same technology as the first supporting member 1 may be used.

The two substrates are then assembled, preferably by direct bonding, a molecular adhesion assembly technique. The conditions may be at least one of the following:

- the supporting member 1 for the first substrate 3 and the supporting member 2 for the second substrate 9 are used to hold each substrate with a vacuum, advantageously on the same 0.1 mm ring situated 5 cm from the edge of the substrates 2, 9, or advantageously by holding with a plurality of small vacuum holes on the overall chuck surface.
- an alignment of the substrates 2, 9 relative to these supporting members 1, 2 less than +−50 μm in both directions of the bonding interface plane is observed; notches or flat sections (generally referred to as notches, and formed on the edges of the substrates, may be used for this purpose.
- the temperatures of the substrates 2, 9 and the supporting members 1, 2 are identical before being placed in contact and preferably equal to 21° C.
- the surrounding atmosphere is composed of 78% nitrogen, 21% oxygen and 1% rare gases at a pressure of 1015 mbar at 21° C. and with 45% relative humidity.

Figure 6:
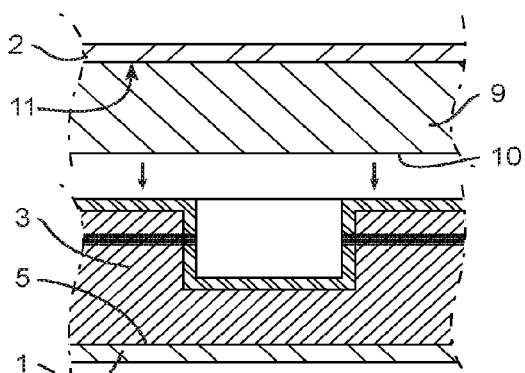
FIG. 6 shows a phase for mounting a second substrate on the first and FIG. 7 shows the assembled configuration thereof.
Figure 7:
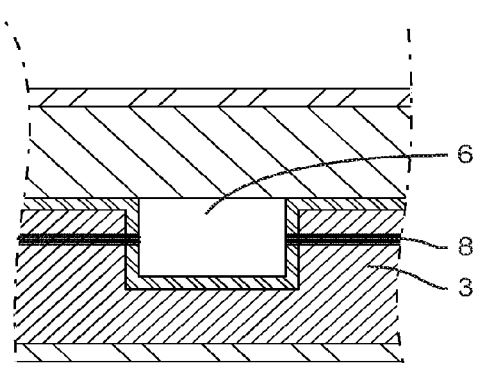

After alignment, the substrates 3, 9 are approached at a distance for example of 70 μm, as in FIG. 6. A local deformation at the center of the second substrate 9 may initiate the contact. This contacting step may last for 20 seconds after the pressing force has been reached (such as 3500 mN). Then the vacuum of the top wafer is removed, enabling the bonding to be completed by releasing the second substrate 9 from the second supporting member 2. After an interval, notably of 30 seconds, the vacuum of the first substrate 3 is released and the bonding is completed. The configuration in FIG. 7 is achieved. The adhesion energy used for this first direct bonding is preferably 110 mJ/m$^2$. The deflection of each substrate 3, 9 before bonding is for example 10 μm. Advantageously, the bonding is performed at a temperature below 100° C., preferably above 5° C. and notably ambient, for example 21° C.

Then, the assembly previously obtained is separated into two parts. For this purpose, for example, thermal annealing (notably at 500° C. for two hours) makes it possible to induce separation at the weakened zone 8 (the hydrogen implantation peak in FIG. 7). A part of the first substrate 3 is then offset with the second substrate 9.

Figure 8:
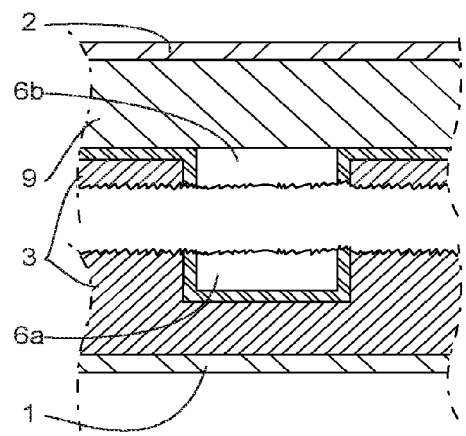
FIG. 8 represents schematically a separation into two parts of the assembly in FIG. 7.
Figure 9:
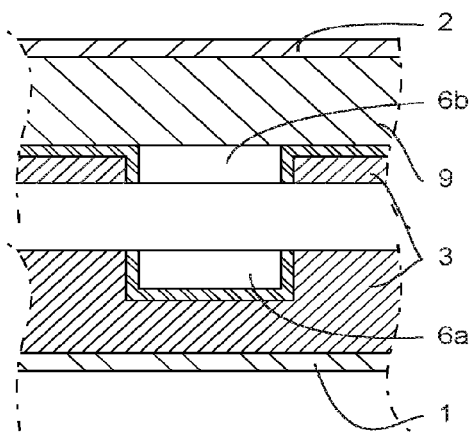
FIG. 9 shows a surface treatment retrospectively to the phase in FIG. 8.

This separation cuts the (primary and/or secondary) alignment mark patterns into two as is the case for the pattern 6 in FIG. 8 where the primary marks 6*a*, 6*b* derived from this pattern 6 can be seen. Each part thus has primary and/or secondary alignment marks. A source of misalignment of the secondary alignment marks is thus removed. Optionally, some secondary marks may act both as secondary marks and primary marks.

After separation, one option is that of polishing the surface of the two parts obtained by cleavage of the assembly, for example with mechanical or mechanochemical polishing. The exposed surfaces of the two separated parts are thus more favorable for subsequent treatments, as in FIG. 9.

According to the applications, further technological steps are indeed advantageously performed on each substrate. This may comprise steps for photolithography, ion etching, thin layer depositions and mechanochemical polishing for example. As a general rule, at least one electronic component 18 is formed on each part, these components 18 being suitable for varying widely according to the applications.

This provides two structures 15, 16, as in FIG. 1 where the components 18 are represented schematically. It is possible to stack same so as to construct a three-dimensional device. If the thickness of the structures 15, 16 requires, an opening may be made so as to access the markings and ensure the continuity of the referencing during manufacture.

Beforehand, it is preferably ensured that the deflection conditions as defined above are still fulfilled. Otherwise, some technological steps such as the deposition of thin layers for stress compensation may be required for example to attain the original deflection specifications.

Figure 10:
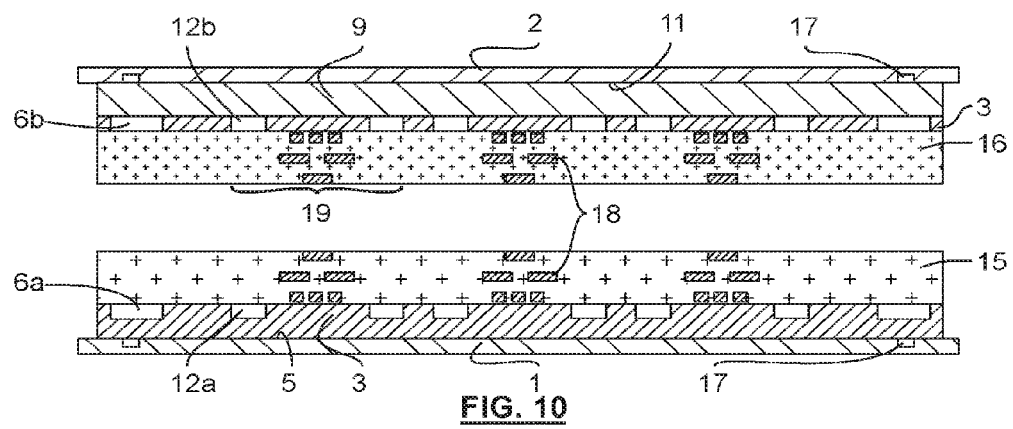
FIG. 10 shows a mounting of two structures obtained from the initial substrates and FIG. 11 gives an assembled configuration thereof so as to form a three-dimensional device.

For the assembly, the supporting member 1 is reused for the structure 15 such that it is once again the first face 5 which engages with the same supporting member 1. Similarly, the supporting member 2 is reused for the structure 16 such that the face 11 is once again in contact therein. Each structure 15, 16 is preferably held under the same conditions as during the steps for holding the substrates with a view to the first assembly. This step is shown in FIG. 10 where primary marks 6*a*, 6*b*, near each edge of the initial substrates, are visible. They may be organized according to a diameter of the first and second substrates. Also, secondary marks 12*a*, 12*b* are formed, for each chip formation zone.

All or part, but advantageously all the conditions of the first direct bonding are repeated for the bonding of the two structures 15, 16. The conditions in respect of temperatures, atmosphere, approach preparation, and direct bonding are thus preferably all reproduced. A maximum tolerance of 1% may nonetheless be adopted in respect of the identity of distance of the surfaces to be bonded before contacting. It may be at most 10% for the bonding force or 1% for the release times of the faces applied to the supporting members 1, 2, or +/−0.1° C. for the temperature. The adhesion energy may optionally vary by not more than 20%. Moreover, the deflections should not be modified by more than +/−10 μm for an initial wafer of 300 mm in diameter and +/−7 μm for an initial wafer of 200 mm in diameter. This optional tolerance is preferably as follows for the surrounding atmosphere of the two bonds: pressure at +−1%, type of gas at +−1% in composition, temperature +−0.1° C., humidity +−5% deviation between the two relative humidity values of the two bonds. The overall alignment of the two structures during the second bond will preferably remain less than +−5 μm, and more specifically less than +−1 μm or 500 nm, or 300 nm or 100 nm.

It should be noted that the alignment of the structures 15, 16 with respect to the supporting members 1, 2 is initially and during the second bonding preferably less than +−50 μm in both directions of the bonding interface plane.

As the conditions of the second bonding are very similar to those of the first, or even identical, this makes it possible to minimize a further source of misalignment of the alignment marks, particularly the secondary marks as the elements are bonded under the same operational conditions.

As such, the two bonds are the most similar, preferably for at least one of the following parameters:

- the alignment of the wafers (substrates or structures) with respect to the supporting members;
- the temperature of the wafers and the supporting members;
- the surrounding atmosphere of the two bonds (pressure, gas type, temperature, humidity);
- the steps for carrying out the two bonds comprising:
    approaching the wafers before contacting,
    the manner wherein the two surfaces are contacted the manner wherein the wafers are detached from the supporting members thereof during the bonding steps;

the adhesion energy used for the direct bonds;

the deflection of the wafers before bonding.

During the alignment before bonding, it is possible to use the primary marks 6a, 6b as alignment references. Optical techniques may be used, for example in the infrared range, by transmission through the structures, in particular if they are based on silicon which is not strongly doped, allowing some transparency. Further techniques such as with microscopes between the structures may be used.

Figure 11:
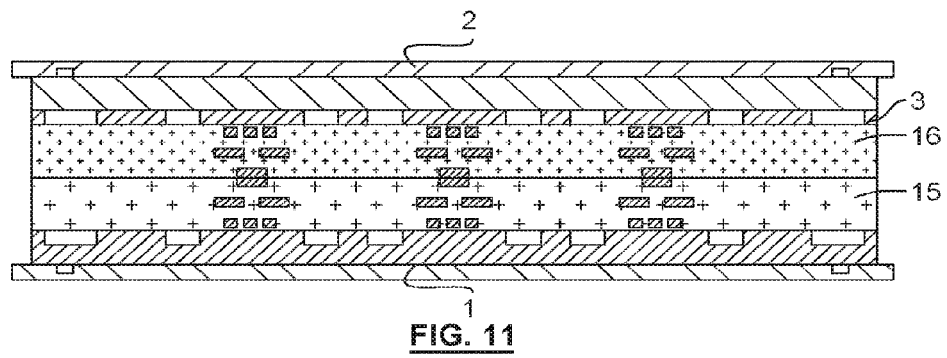

The result of the bonding, before releasing the hold of the supporting members 1, 2 can be seen in FIG. 11. The device is finalized, unless further manufacturing steps are to be performed subsequently. At the very least, the stacking of the two structures 15, 16 was performed under optimum alignment conditions.

REFERENCES

1. First supporting member
2. Second supporting member
3. First substrate
4. Second face
5. First face
6. Pattern
6a, 6b. Primary mark
7. Insulating layer
8. Weakened zone
9. Second substrate
10. Second face
11. First face
12a, 12b. Secondary mark
13. Functional assembly
14. Functional assembly
15. First structure
16. Second structure
17. Ring
18. Components
19. Individual zone
a. Height of pattern
b. Height of insulating layer

The invention claimed is:

1. A method for producing an electronic device comprising in a stack at least a first structure and a second structure, the structures being obtained from a first substrate and a second substrate, the method comprising the following steps:

forming at least one hollowed mark pattern on a second face, opposite a first face, of the first substrate;

positioning of the first face of the first substrate on a first supporting member;

positioning of a first face of the second substrate on a second supporting member;

assembling the two substrates by the second face of the first substrate and a second face, opposite the first face, of the second substrate;

separating the first substrate into two parts according to a dimension in thickness of the first substrate so as to form a first part of the first substrate remaining in position on the first supporting member, and a second part of the first substrate remaining assembled with the second substrate, the first part of the first substrate comprising a first mark formed by a first portion of the mark pattern, the second part of the first substrate comprising a second mark formed by a second portion of the mark pattern;

producing at least one electronic component on the first part of the first substrate so as to form the first structure and of at least one electronic component on the second part of the first substrate so as to form the second structure;

assembling the first structure and the second structure, the first face of the first substrate being in position on the first supporting member and the first face of the second substrate being in position on the second supporting member, by approaching the first supporting member and the second supporting member while aligning the first mark and the second mark.

2. The method according to claim 1, wherein the first face of the first substrate is detached from the first supporting member and the first face of the second substrate is detached from the second supporting member after assembling the two substrates, and wherein the first face of the first substrate is once again attached to the first supporting member and the first face of the second substrate is once again attached to the second supporting member after producing at least one electronic component.

3. The method according to claim 1, wherein the step of assembling the two substrates and the step of assembling the first structure and the second structure are performed by direct bonding.

4. The method according to claim 3, wherein the step of assembling the two substrates and the step of assembling the first structure and the second structure are performed by direct bonding with the same adhesion energy.

5. The method according to claim 3, wherein the step of assembling the two substrates and the step of assembling the first structure and the second structure are performed by direct bonding with the same pressure force applied, for both steps at the same point, by the first supporting member (3) and the second supporting member to the first faces of the first and second substrates.

6. The method according to claim 1, wherein the step of assembling the two substrates and the step of assembling the first structure and the second structure are performed with an identical value for at least one of the parameters chosen from: the temperature of the supporting members and the substrates; the pressure, temperature, hygrometry and composition of the atmosphere.

7. The method according to claim 1, wherein assembling the two substrates comprises approaching the first supporting member and the second supporting member, contacting the second surface of the first substrate and the second face of the second substrate so as to produce direct bonding, followed detaching the first face of the second substrate relative to the second supporting member.

8. The method according to claim 7, wherein detaching the first face of the second substrate relative to the second supporting member is followed by detaching the first face of the first substrate relative to the first supporting member.

9. The method according to claim 1, wherein the formation of at least one mark pattern comprises:

etching the mark pattern with a predetermined height according to a dimension in thickness of the first substrate;

forming a weakened zone, said weakened zone having a height level lower than the height of the mark pattern;

and wherein separating the first substrate into two parts comprises a treatment configured to break the weakened zone.

10. The method according to claim 9, wherein forming the weakened zone comprises ion implantation.

11. The method according to claim 1, wherein a plurality of hollowed mark patterns are formed on the second face of the first substrate so as to form a plurality of first marks and a plurality of second marks.

12. The method according to claim 11, wherein a first substrate of circular cross-section is used and wherein the plurality of mark patterns comprises two primary mark patterns situated at diametrically opposed edges of the first substrate.

13. The method according to claim 11, wherein the first substrate comprises a plurality of individual zones for producing a microelectronic chip and wherein the plurality of mark patterns comprises at least one secondary mark pattern in each individual zone.

14. The method according to claim 1, wherein at least one of the faces situated facing the first structure and the second structure is formed by the surface of a layer of non-monocrystalline material.

* * * * *